United States Patent
Cheung et al.

(10) Patent No.: US 8,026,126 B2
(45) Date of Patent: Sep. 27, 2011

(54) APPARATUS AND METHOD FOR THIN DIE DETACHMENT

(75) Inventors: Yiu Ming Cheung, Hong Kong (CN); Chi Ming Chong, Hong Kong (CN); Tat Wing Lee, Hong Kong (CN); Ka Lok Leung, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 1828 days.

(21) Appl. No.: 10/628,503

(22) Filed: Jul. 28, 2003

(65) Prior Publication Data

US 2004/0115904 A1 Jun. 17, 2004

Related U.S. Application Data

(60) Provisional application No. 60/430,010, filed on Nov. 27, 2002.

(51) Int. Cl.
*H01L 21/00* (2006.01)
(52) U.S. Cl. .................. 438/106; 257/E21.499
(58) Field of Classification Search .................. 438/106; 257/E21.499
See application file for complete search history.

(56) References Cited

U.S. PATENT DOCUMENTS

| | | | | |
|---|---|---|---|---|
| 4,556,362 A | * | 12/1985 | Bahnck et al. | 414/744.3 |
| 4,850,780 A | | 7/1989 | Safabakhsh et al. | 414/417 |
| 5,589,029 A | | 12/1996 | Matsui et al. | |
| 5,755,373 A | | 5/1998 | Nakamura | 228/6.2 |
| 6,201,306 B1 | | 3/2001 | Kurosawa et al. | |
| 6,202,292 B1 | * | 3/2001 | Farnworth et al. | 29/743 |
| 6,505,397 B1 | * | 1/2003 | Mimata et al. | 29/740 |
| 6,774,011 B2 | * | 8/2004 | Nakazawa et al. | 438/464 |
| 6,777,313 B2 | * | 8/2004 | Takyu et al. | 438/464 |
| 2001/0017403 A1 | | 8/2001 | Kurosawa et al. | |

FOREIGN PATENT DOCUMENTS

| | | | |
|---|---|---|---|
| EP | 0 431 637 A1 | | 6/1991 |
| JP | 62-232935 | | 10/1987 |
| JP | 11-207532 | * | 8/1999 |
| JP | 2001-094298 | * | 4/2001 |

* cited by examiner

*Primary Examiner* — William D Coleman
(74) *Attorney, Agent, or Firm* — Ostrolenk Faber LLP

(57) ABSTRACT

The invention provides an apparatus and method for thin die detachment involving the use of a collet for holding and detaching a die mounted on an adhesive surface of an adhesive film. An ejector device comprising a plurality of ejector pins is employed to partially delaminate said die from the adhesive surface for detachment by the collet. Each ejector pin is operative to contact and raise a second surface of the film opposite the adhesive surface at a position substantially at a corner of the die to be detached within a predetermined distance from the edges of said die.

8 Claims, 4 Drawing Sheets

APPARATUS AND METHOD FOR THIN DIE DETACHMENT

RELATED APPLICATIONS

This application claims the benefit of U.S. Provisional Application Serial No. 60/430,010, filed Nov. 27, 2002.

FIELD OF THE INVENTION

This invention relates to an apparatus and method of using multiple ejector pins located at specific locations with respect to a die for the detachment of thin dice during die bonding of electronic packages.

BACKGROUND AND PRIOR ART

In wafer processing, wafers comprising arrays of semiconductor dice are usually received after dicing on a film frame, and are fed to die bonding machines for placement. In a typical die bonding process, dice are detached and lifted from a film frame comprising plastic adhesive film or a Mylar film and are then transferred to a substrate such as a lead frame or printed wiring board (PWB) substrate. Typically, in a pick-up process, a designated die will first be aligned and moved to a location where push-up pins will rise to raise a die from below while the plastic adhesive film is held down by vacuum suction. A collet or pick-up tool is then moved to just above the top surface of the die. The die will be detached from the plastic adhesive film when the push-up pins rise to an appropriate level. The collet provides vacuum suction to hold the die during the action of transferring the die from the plastic adhesive film to the bonding substrate.

Conventionally, for small dice (say, less than 2 mm in width), one ejector pin positioned at the center of the die to be detached is used. However, for larger dice, multiple ejector pins are used in order to evenly distribute the push-up force on the die and reduce a pinching effect by the ejector pins. When the dice get thinner, there is always a chance that a die may break or crack during the detachment process of the die from the plastic adhesive film. The breakage of the die is primarily due to the fact that the stress induced by the pushing up of the pins reaches the critical failure bending stress of the die before the delamination of the interface between the die and the plastic adhesive film takes place. This will be more problematic for (i) dice of bigger size, (ii) thinner dice, and (iii) attachments where there is stronger adhesion force between the die and the plastic adhesive film.

A prior art pick-up process includes a typical push-up mechanism using one ejector pin or multiple ejector pins. FIG. 1 shows a typical layout of the push-up device and its peripheral devices. On a vacuum ejector platform, hole(s) on a cap connected to a vacuum suction supply is used to hold a designated die and the plastic adhesive film in position during the die detachment process. Inside the cap of the vacuum ejector platform, a chuck holds ejector pins and is connected to a motorized mechanism that provides a vertical pushing motion for the ejector pins. During the push-up motion, the ejector pins move upward and push onto a die and the plastic adhesive film. As a result, the die mounted on the plastic adhesive film starts to be delaminated and separates from the film. As the ejector pin rises to certain level, the adhesive force and adhered area between the die and plastic adhesive film are small enough such that it is possible for the pick-up collet to pull the die away from the film by suction means.

U.S. Pat. No. 5,755,373 for a "Die Push-Up Device" uses a die push-up device with only one push-up ejector pin in a bonding machine for semiconductor devices. This invention is applicable for small and thick dice (say, more than 0.2 mm thick). As the size of the die gets bigger (say, more than 5 mm in width), a two-stage ejecting process (such as that in U.S. Pat. No. 4,850,780 for a "Pre-Peel Die Ejector Apparatus") may be used. In relation to U.S. Pat. No. 5,755,373, using a single ejector pin to perform the die detachment process will not be practical if a thin (less than 0.1 mm thick) and large die (more than 4—mm width) is involved.

For prior art devices using multiple pins, such as U.S. Pat. No. 4,850,780 and US publication number 2001/0017403A1, the locations of the pins are not optimized for handling very thin dice (say, less than 0.1 mm thick). These designs can reduce somewhat the pinching force and minimize any damage to the die during the pick-up process. However, for a large (e.g. more than 4 mm width) and thin (e.g. less than 0.1 mm thick) die, an optimized design for the multiple pushing-up ejector pins is needed in order to prevent the die from cracking during the pick-up process.

SUMMARY OF THE INVENTION

It is an object of the invention to seek to maximize an interfacial peeling stress and enhance interfacial delamination between an interface of a die and an adhesive film without causing damage to the die during a die pick-up process.

According to a first aspect of the invention, there is provided an apparatus for thin die detachment comprising: a film having an adhesive surface on which a plurality of dice are mountable; a collet for holding and detaching a die mounted on the adhesive surface; and an ejector device comprising a plurality of ejector pins, each ejector pin operative to contact and raise a second surface of the film opposite the adhesive surface at a position substantially at a corner of the die to be detached within a predetermined distance from the edges of said die, whereby to partially delaminate said die from the adhesive surface for detachment by the collet.

According to a second aspect of the invention, there is provided a method of detaching a thin die mounted on an adhesive surface of a film, comprising the steps of: contacting and raising a second surface of the film opposite the adhesive surface with a plurality of ejector pins at positions substantially at the corners of the die within a predetermined distance from the edges of said die; pushing against the film at positions substantially at the corners of the die to partially delaminate the die; and holding the partially-delaminated die and detaching the die from the adhesive surface.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus and method in accordance with the invention will now be described with reference to the accompanying drawings, in which.

DESCRIPTION OF THE PREFERRED EMBODIMENT OF THE INVENTION

Figure 1:
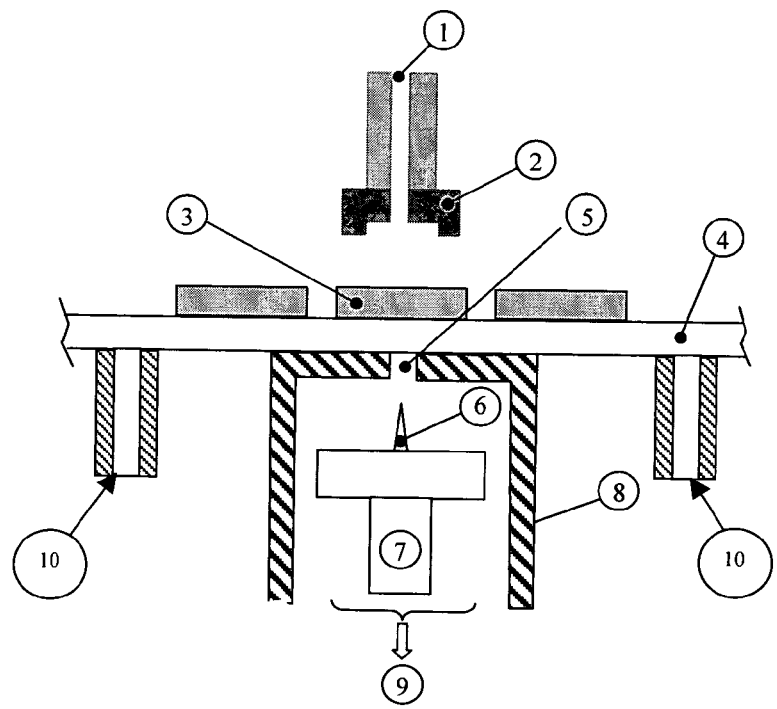
FIG. 1 is a diagrammatic cross-sectional side-view representation of a die ejector device and peripheral devices of the prior art.

An ejector device and its peripheral devices for a die detachment process of the prior art are shown in FIG. 1. A plurality of dice 3 are singulated and attached to a plastic adhesive film 4. The plastic adhesive film 4 is mounted to a wafer table with expander (not shown) that moves the dice 3 with respect to a vacuum ejector platform 8. This vacuum ejector platform 8 is an enclosure containing a mechanism driving a chuck 7 supporting one or more ejector pins 6. The chuck 7 provides the mounting holes and brackets for the ejector pins 6 and it is driven up and down by a motorized mechanism (not shown). Moving a die 3 designated to be picked up to the center of the vacuum ejector platform 8 starts a pick-up cycle. The plastic adhesive film 4 is held down against the top surface of the platform 8 by vacuum suction connected to a vacuum suction supply 9 via a hole 5 at the top of the vacuum ejector platform 8 and a periphery of the plastic adhesive film 4 is held down by additional vacuum suction provided through an outer ring 10. The ejector pins 6 that rise above the top surface of the vacuum ejector platform 8 will lift up the die 3 on the plastic adhesive film 4. In the meantime, a collet 2 moves down and rests on top of the die 3 with its suction vacuum supply 1 on, to hold and detach the die 3 from the adhesive film 4.

Figure 2A:
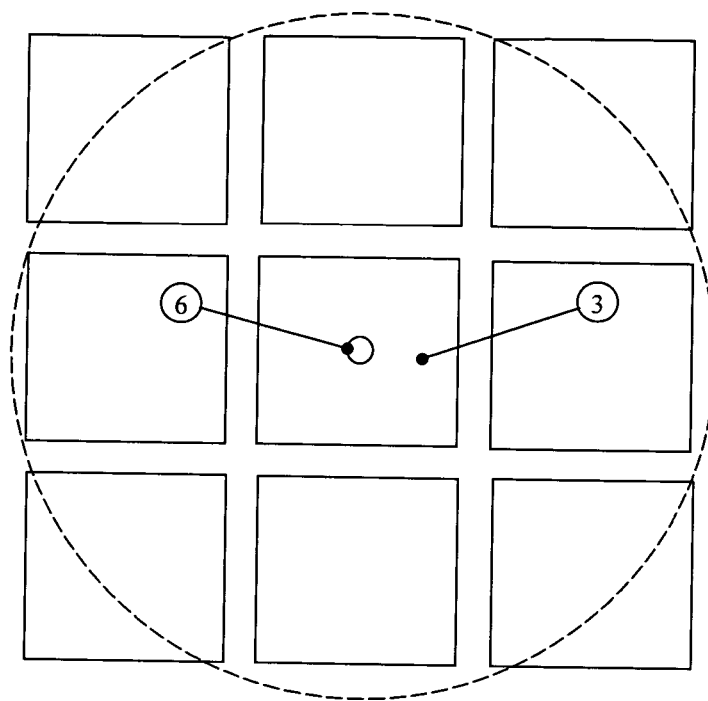
FIGS. 2a and 2b are top views of arrangements of ejector pins of the prior art push-up device with (a) one ejector pin, and (b) multiple ejector pins respectively.
Figure 2B:
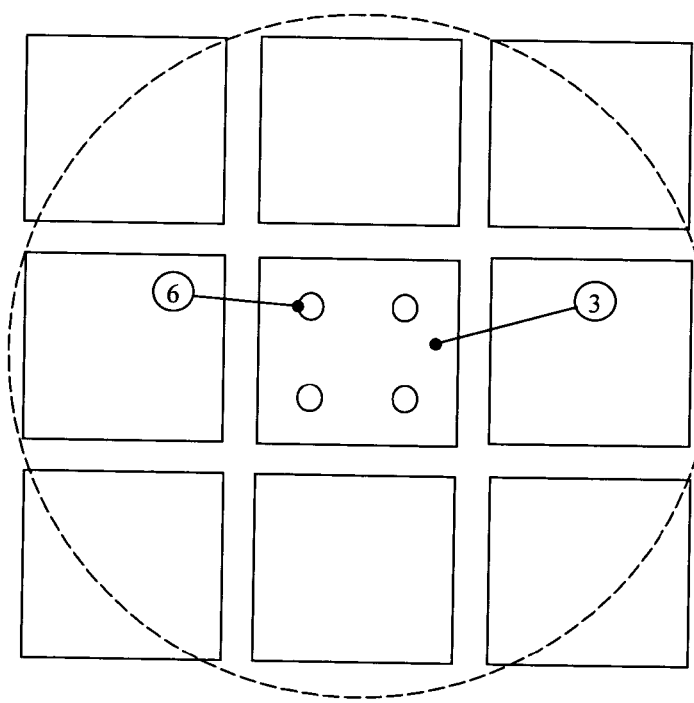

In the prior art, the designated die is pushed up either by one ejector pin or multiple ejector pins as shown in FIGS. 2a and 2b, or by a two-stage push-up motion (as in U.S. Pat. No. 4,850,780). There is no particular arrangement of the pins. The prior art is suitable for the detachment of small and thick dice. With dice getting thinner and their sizes getting bigger, there is a very high chance that a die will crack and break into two or more pieces during a die detachment process when the ejector pins 6 push up against the die 3 on the plastic adhesive film 4.

Figure 3:
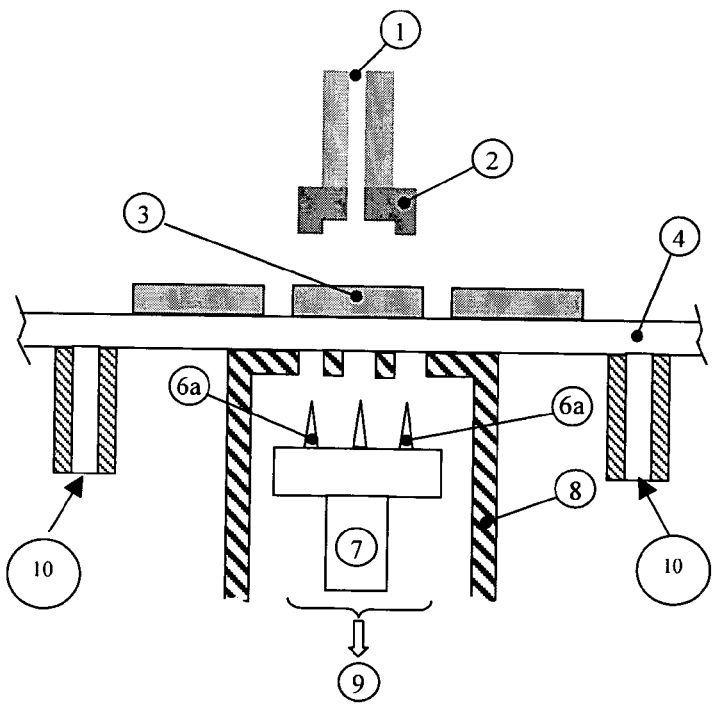
FIG. 3 is a diagrammatic cross-sectional side-view representation of a die ejector device and peripheral devices according to the preferred embodiment of the present invention.

An ejector device and its peripheral devices according to the preferred embodiment of the present invention is shown in FIG. 3. A plurality of dice 3 are mounted on an adhesive surface of a film 4. A collet 2 having vacuum suction 1 is provided for holding and detaching a die 3 mounted on the adhesive surface of the adhesive film 4. An ejector device comprises a plurality of ejector pins 6, 6a, wherein four of the ejector pins 6a are operative to contact and raise a second surface of the film 4 opposite the adhesive surface. Each of the four ejector pins 6a are located at a position substantially at a corner of the die 3 to be detached within a predetermined distance from the edges of said die 3. The ejector pins 6, 6a are supported by a movable chuck 7. As the die 3 is partially delaminated from the adhesive surface of the film 4, the collet 2 is lowered to detach the die 3.

During contact of the film 4 by the ejector pins 6, 6a, a vacuum ejector platform 8 is provided to support a portion of the film 4 on which the die 3 to be detached is mounted. It includes apertures corresponding substantially to positions of each corner of the die to be detached, and also one or more apertures corresponding to a center portion of the die 3, where the ejector device includes an ejector pin or pins 6 contacting the center portion of the die 3. The ejector pins 6, 6a are housed within the vacuum ejector platform 8 and projectable through the said apertures to contact the film 4 beneath the die 3.

The film 4 is secured to the top of the vacuum ejector platform 8 by vacuum suction generated from a vacuum suction supply 9. The film 4 is also held down by additional vacuum suction provided through an outer ring 10.

Figure 4A:
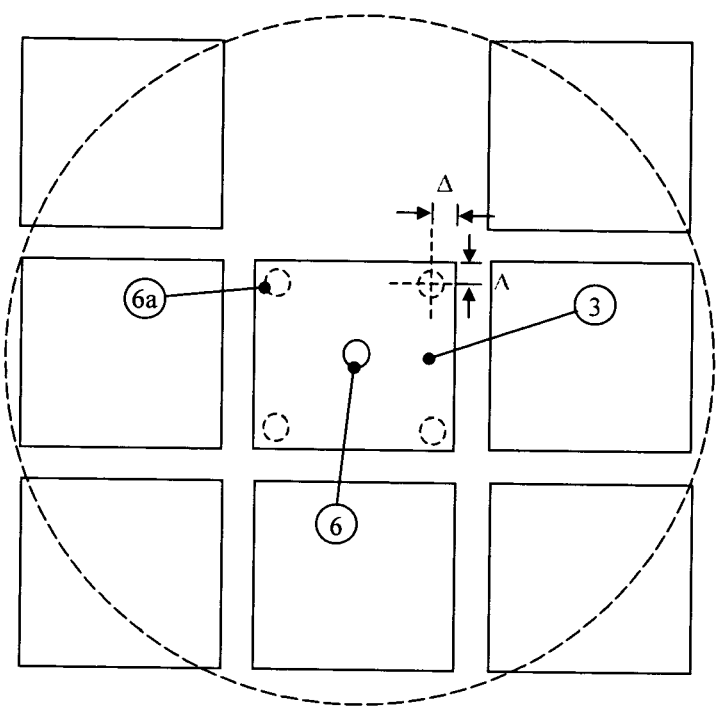
FIGS. 4a, 4b and 4c are top views of different arrangements of ejector pins of the ejector device of the preferred embodiment with multiple ejector pins positioned near the corners of a die within a predetermined distance A from its edges.
Figure 4B:
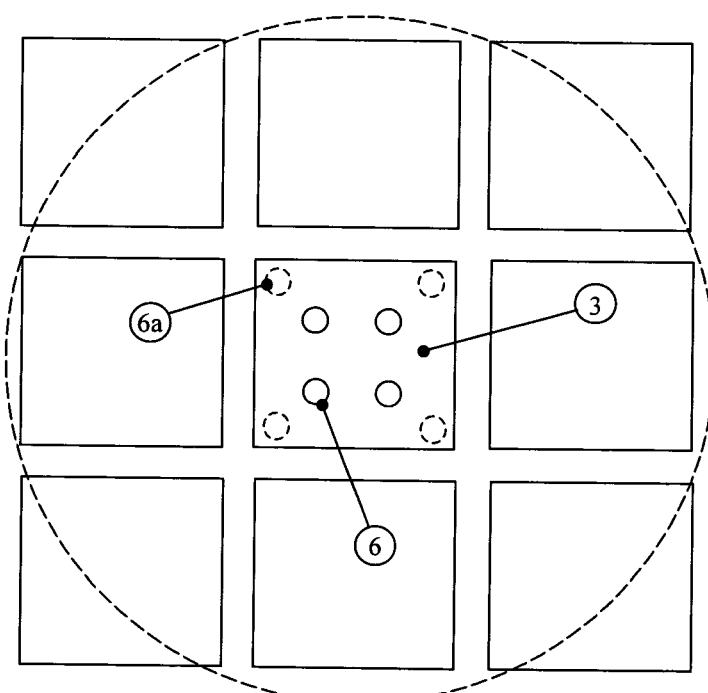
Figure 4C:
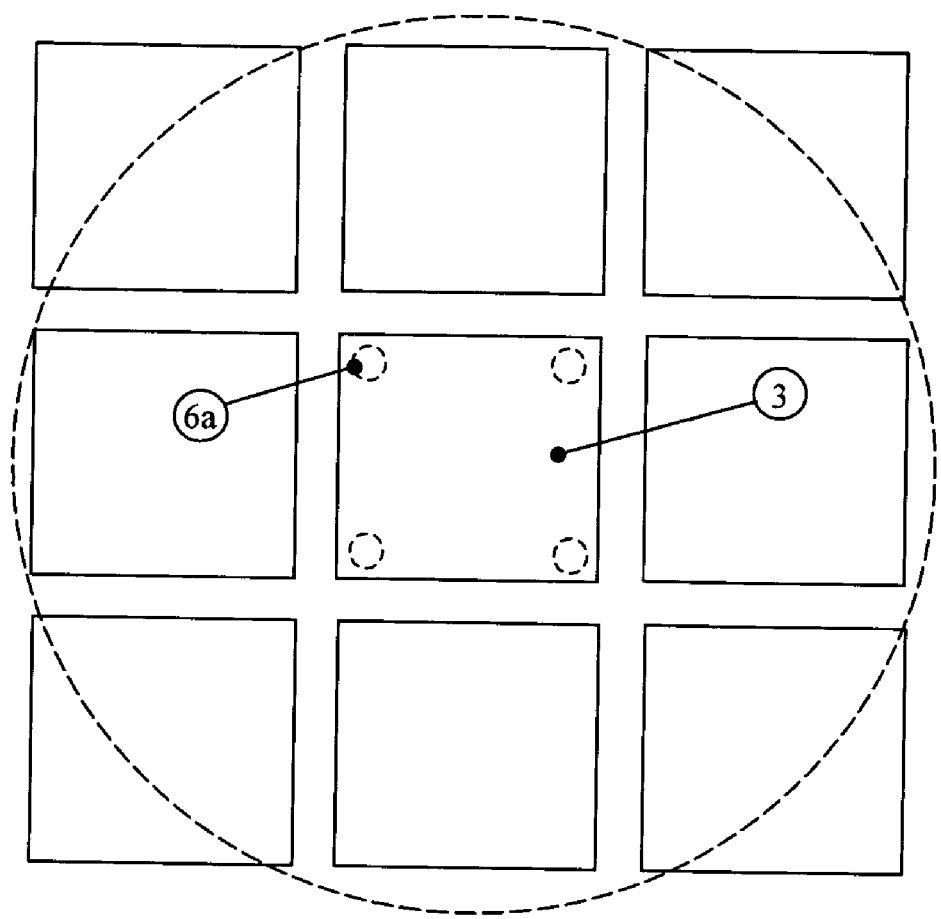

The invention is important particularly in handling thin and large dice. In order to achieve the preferred effects, the corner ejector pins 6a should be kept within a predetermined distance A from the edges of the die 3. This could include another ejector pin or pins 6 at substantially the center portion of the die 3 as shown in FIG. 4a or 4b or the center ejector pin or pins 6 may be dispensed with, as shown in FIG. 4c.

The predetermined distance is determinable by considering one or more of the following factors:

(i) The thickness, size and elastic modulus of the die 3. $\Delta$ may be greater if the die 3 is thicker, smaller and/or more elastic.

(ii) The thickness and elastic modulus of the film 4. $\Delta$ may be greater if the film 4 is thicker and/or more elastic.

(iii) The interfacial adhesive strength between the die 3 and the elastic surface of the film 4. $\Delta$ may be greater if the interfacial adhesive strength is lower.

(iv) The shape and size of the ejector pin 6, 6a. $\Delta$ may be greater if the effective support area of the ejector pin 6, 6a is greater.

The predetermined distance $\Delta$ should be less than a critical value $\Delta c$. By way of example only, the following are some values of $\Delta c$ that are preferred in specific instances:

(i) The predetermined distance is preferably less than 1.2 mm from the edges of the die 3 where the die 3 is a silicon die of between 3 mm to 8 mm in width and less than 0.15 mm thickness, the film 4 has a thickness of approximately 0.1 mm and an interfacial adhesive strength between the die 3 and the adhesive surface is less than 15 Joules per meter square.

(ii) The predetermined distance is preferably less than 1.6 mm from the edges of the die 3 where the die 3 is a silicon die of greater than 8 mm in width and less than 0.15 mm thickness, the film 4 has a thickness of approximately 0.1 mm and an interfacial adhesive strength between the die 3 and the adhesive surface is less than 15 Joules per meter square.

(iii) The predetermined distance is preferably less than 0.6 mm from the edges of the die 3 where the die 3 is a gallium arsenide (GaAs) die of between 3 mm to 8 mm in width and less than 0.15 mm thickness, the film 4 has a thickness of approximately 0.1 mm and an interfacial adhesive strength between the die 3 and the adhesive surface is less than 15 Joules per meter square.

Due to the respective properties of GaAs and silicon, the specific distance A for a GaAs die will generally be smaller than that of a silicon die. There should be a finite size for the ejector pins 6 or any form of support to provide an effective contact area to push against the plastic adhesive film 4 and during the die detachment process. Each ejector pin 6, 6a preferably has an effective support area of at least $1 \times 10^{-4}$ mm$^2$.

It should be appreciated that, as a result of arranging the multiple ejector pins 6a of finite size at each corner of the die, the distribution of a high interfacial peeling stress region concentrates to along the edges and near the corners of the die 3. The arrangement of the ejector pins 6a at each corner of the die 3 increases the normal interfacial peeling stress such that it aids the delamination of the interface between the die 3 and the plastic adhesive film 4—it is easier for the die 3 to be detached from the plastic adhesive film 4 before it cracks. The arrangements of the plurality of ejector pins 6a at each corner of the die 3 also reduce the deformation stresses, in particular the bending mode in the die 3 and hence reduce the chance of die crack induced by the die detachment process.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for detachment of a thin die from a film, the film having a adhesive surface an which a plurality of dice are mounted, the apparatus comprising:
    an ejector device comprising a plurality of ejector pins,
    the ejector pins being operative to initiate detachment of a die from the film by contacting the film under the die on a second surface of the film opposite the adhesive surface substantially at the corners of the die within a predetermined distance from the edges of
    said die and by raising the film under the corners of the die; and
    a collet operative to detach the die from the film after detachment has been initiated by the ejector device, and to hold the die after detachment from the film;
    wherein the predetermined distance is less than 1.2 mm from the edges of the die where the die is a silicon die of between 3 mm to 8 mm in width and less than 0.15 mm thickness, the film has a thickness of approximately 0.1 mm and an interfacial adhesive strength between the die and the adhesive surface is less than 15 Joules per meter square.

2. An apparatus for detachment of a thin die from a film, the film having a adhesive surface on which a plurality of dice are mounted, the apparatus comprising:
    an ejector device comprising a plurality of ejector pins,
    the ejector pins being operative to initiate detachment of a die from the film by contacting the film under the die on a second surface of the film opposite the adhesive surface substantially at the corners of the die within a predetermined distance from the edges of said die and by raising the film under the corners of the die; and
    a collet operative to detach the die from the film after detachment has been initiated by the ejector device, and to hold the die after detachment from the film;
    wherein the predetermined distance is less than 1.6 mm from the edges of the die where the die is a silicon die of greater than 8 mm in width and less that 0.15 mm thickness, the film has a thickness of approximately 0.1 mm and an interfacial adhesive strength between the die and the adhesive surface is less than 15 Joules per meter square.

3. An apparatus for detachment of a thin die from a film, the film having a adhesive surface on which a plurality of dice are mounted, the apparatus comprising;
    an ejector device comprising a plurality of ejector pins,
    the ejector pins being operative to initiate detachment of a die from the film by contacting the film under the die on a second surface of the film opposite the adhesive surface substantially at the corners of the die within a predetermined distance from the edges of
    said die and by raising the film under the corners of the die; and
    a collet operative to detach the die from the film after detachment has been initiated by the ejector device, and to hold the die after detachment from the film;
    wherein the predetermined distance is less than 0.5 mm from the edges of the die where the die is a gallium arsenide die of between 3 mm to 8 mm in width and less than 0.15 mm thickness, the film has a thickness of approximately 0.1 mm and an interfacial adhesive strength between the die and the adhesive surface is less than 15 Joules per meter square.

4. An apparatus for detachment of a thin die from a film, the film having a adhesive surface on which a plurality of dice are mounted, the apparatus comprising:
    an ejector device comprising a plurality of ejector pins,
    the ejector pins being operative to initiate detachment of a die from the film by contacting the film under the die on a second surface of the film opposite the adhesive surface substantially at the corners of the die within a predetermined distance from the edges of
    said die and by raising the film under the corners of the die; and
    a collet operative to detach the die from the film after detachment has been initiated by the ejector device, and to hold the die after detachment from the film;
    wherein the ejector device comprises at least four ejector pins, each ejector pin corresponding to a position substantially at a corner of the die, and one or more ejector pins corresponding to a position substantially at a center portion of the die.

5. An apparatus as claimed in claim 4, wherein the predetermined distance is determined by considering one or more factors in the group consisting of the thickness, size and elastic modulus of the die the thickness and elastic modulus of the film, the interfacial adhesive strength between the die and the elastic surface of the film and the shape and size of the ejector pin.

6. An apparatus as claimed in claim 4, including a vacuum ejector platform for supporting a portion of the film on which the die to be detached is mounted while the film is contacted by the ejector device.

7. An apparatus as claimed in claim 4, wherein each ejector pin has an effective support area of at least $1 \times 10^{-4}$ mm$^2$.

8. An apparatus as claimed in claim 6, including apertures corresponding substantially to positions of each corner of the die to be detached, wherein the ejector pins are houseable within the vacuum ejector platform and projectable through said apertures for contacting the die.

* * * * *